(12) United States Patent
Tanaka

(10) Patent No.: US 7,941,773 B2
(45) Date of Patent: May 10, 2011

(54) SIMULATION SYSTEM TO VERIFY MULTICYCLE PATH BASED ON CIRCUIT OPERATIONAL SPECIFICATION AND CIRCUIT DESIGN SPECIFICATION

(75) Inventor: Kiyotaka Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 340 days.

(21) Appl. No.: 12/158,884

(22) PCT Filed: May 28, 2007

(86) PCT No.: PCT/JP2007/060784
§ 371 (c)(1),
(2), (4) Date: Jun. 23, 2008

(87) PCT Pub. No.: WO2008/050505
PCT Pub. Date: May 2, 2008

(65) Prior Publication Data
US 2009/0282376 A1    Nov. 12, 2009

(30) Foreign Application Priority Data

Oct. 24, 2006 (JP) ................................. 2006-288330

(51) Int. Cl.
*G06F 17/50* (2006.01)
(52) U.S. Cl. .................... 716/108; 703/14; 714/731
(58) Field of Classification Search .................. 716/108; 703/14; 714/731
See application file for complete search history.

(56) References Cited

U.S. PATENT DOCUMENTS

| | | | | |
|---|---|---|---|---|
| 5,825,658 A | * | 10/1998 | Ginetti et al. ................ | 716/6 |
| 5,956,256 A | * | 9/1999 | Rezek et al. ................ | 716/3 |
| 6,061,511 A | * | 5/2000 | Marantz et al. ............. | 703/28 |
| 6,075,936 A | * | 6/2000 | Mori et al. ................... | 703/15 |
| 6,763,489 B2 | * | 7/2004 | Nadeau-Dostie et al. .... | 714/731 |
| 7,096,438 B2 | * | 8/2006 | Sivaraman et al. ........... | 716/5 |
| 7,131,087 B2 | * | 10/2006 | Higuchi ....................... | 716/6 |
| 7,224,185 B2 | * | 5/2007 | Campbell et al. ............ | 326/46 |
| 7,305,650 B1 | * | 12/2007 | Jensen ......................... | 716/18 |
| 2004/0098685 A1 | | 5/2004 | Higuchi | |
| 2004/0163021 A1 | * | 8/2004 | Nadeau-Dostie ............ | 714/726 |
| 2006/0123378 A1 | * | 6/2006 | Cizl et al. .................... | 716/18 |
| 2006/0271345 A1 | * | 11/2006 | Kasuya ....................... | 703/14 |
| 2009/0327986 A1 | * | 12/2009 | Goswami et al. ........... | 716/6 |

FOREIGN PATENT DOCUMENTS

| | | |
|---|---|---|
| JP | 2001-273351 | 10/2001 |
| JP | 2004-171149 | 6/2004 |
| JP | 2006318121 A * | 11/2006 |

* cited by examiner

*Primary Examiner* — Naum Levin
(74) *Attorney, Agent, or Firm* — McDermott Will & Emery LLP

(57) ABSTRACT

A simulation system for performing simulation of an operation of a circuit including a particular signal substituting section for making, in the simulation, an output signal of a first flipflop or an input signal of a second flipflop be a particular signal indicating neither high level nor low level during a period which is 1 cycle shorter than a specified clock cycle number of a multicycle path which has been specified in advance; and an output section for outputting information corresponding to whether or not a signal at an output terminal of the second flipflop or at part of the circuit located in a subsequent stage of the output terminal of the second flipflop, which has been specified in advance, is made to be the particular signal.

9 Claims, 8 Drawing Sheets

FIG. 9

```
module multicycle(CK,D1,EN1,EN2,EN3,Q2,Q3);
input CK,D1,EN1,EN2,EN3;
output Q2,Q3;
reg Q1,Q2,Q3;
wire D23;
assign D23=Q1;
always @(posedge CK) begin
 if(EN1)
    Q1 <= D1;
end
always @(posedge CK) begin
 if(EN2)
    Q2 <= D23;
end
always @(posedge CK) begin
 if(EN3)
    Q3 <= D23;
end
endmodule
```

FIG. 10

```
module multicycle(CK,D1,EN1,EN2,EN3,Q2,Q3);
input CK,D1,EN1,EN2,EN3;
output Q2,Q3;
reg Q1A,Q1B,Q2,Q3;
wire D2,D3;
assign D2=Q1A;
assign D3=Q1B;
always @(posedge CK) begin
 if(EN1)begin
    Q1A <= D1;
    Q1B <= D1;
end
end
always @(posedge CK) begin
 if(EN2)
    Q2 <= D2;
end
always @(posedge CK) begin
 if(EN3)
    Q3 <= D3;
end
endmodule
```

SIMULATION SYSTEM TO VERIFY MULTICYCLE PATH BASED ON CIRCUIT OPERATIONAL SPECIFICATION AND CIRCUIT DESIGN SPECIFICATION

RELATED APPLICATIONS

This application is the U.S. National Phase under 35 U.S.C. §371 of International Application No. PCT/JP2007/060784, filed on May 28, 2007, which in turn claims the benefit of Japanese Patent Application No. 2006-288330, filed on Oct. 24, 2006, the disclosures of which Applications are incorporated by reference herein.

TECHNICAL FIELD

The present invention relates to a simulation system for obtaining information for a multicycle path in a digital circuit designed based on a circuit functional specification (including an operational specification and a design specification).

BACKGROUND ART

In general, a digital circuit is designed based on a function specification and RTL description, i.e., description of a register transfer level (RTL), or the like is formed. Logic synthesis constraint conditions in consideration of a timing constraint are also formed based on the function specification. The RTL description and the logic synthesis constraint conditions are input to a logic synthesis tool to generate a netlist at a gate level satisfying the timing constraint (timing specification).

The logic synthesis constraint conditions include, as a timing exception, a multicycle path specification indicating that a signal propagation path from an output terminal of one of a pair of flipflops connected without any flipflop interposed therebetween to an input terminal of the other one of the flipflops is a propagation path allowed to require a plurality of clock cycles for signal propagation. The logic synthesis constraint conditions also include a condition (which will be hereafter referred to as "multicycle number") indicating a maximum amount of time, i.e., the largest number of clock cycles is allowed for signal propagation on each multicycle path. In the logic synthesis tool, if the above-described multicycle path specification (or a timing exception specification such as a false path specification) is not included, logic synthesis is performed such that signal propagation between sequential circuits is counted as 1 cycle. On the other hand, if the multicycle path specification is included, logic synthesis is performed for a specified path such that an amount of time required for signal propagation is smaller than a specified multicycle number.

Normally, the above-described logic synthesis constraint conditions for the multicycle path are manually obtained based on a functional specification. Therefore, logic synthesis is frequently performed using incorrect conditions. In such a case, a generated logic circuit might not be properly operated or, even if a generated logic circuit is properly operated, a circuit size might be increased because of excessive timing adjustment.

To cope with the above-described situations, there has been a proposed method in which a delay information is buried in RTL description and validation is performed by analyzing the delay information to extract a multicycle path candidate and running the multicycle path candidate against a separately generated multicycle path specification (see, for example, Patent Reference 1).

Moreover, a technique in which a target circuit is analyzed, for example, in response to the name of each device, the meaning of a signal to a terminal or the relationship thereof and a multicycle path is automatically detected has been proposed (see, for example, Patent Reference 2).

Patent Reference 1: Japanese Laid-Open Publication No. 2001-273351
Patent Reference 2: Japanese Laid-Open Publication No. 2004-171149

DISCLOSURE OF THE INVENTION

Problems that the Invention is to Solve

However, in the method in which delay information is buried in RTL description and then analysis performed, if the delay information itself is incorrect, proper validation can not be performed and, moreover, burying the delay information requires time and work.

In Patent Reference 2, although what kind of processing is performed using what kind of information is not specifically described, the part describing that a target circuit is analyzed in response to the name of each device, the meaning of a signal to a terminal and the relationship thereof and thereby a multicycle path is automatically detected implies that a multicycle path is detected based on a functional specification and RTL description. Therefore, if the RTL description itself is incorrect, improper multicycle path specification is obtained.

In view of the above-described points, the present invention has been devised and it is therefore an object of the present invention to make it possible to obtain accurate information for a multicycle path in a simple manner.

Solution to the Problems

To solve the above-described problems, a first embodiment of the present invention is directed to a simulation system for performing simulation of an operation of a circuit when it is assumed that a delay does not occur in a combination logic circuit, based on circuit information indicating a circuit configuration of the circuit including a first flipflop and a second flipflop to which an output signal of the first flipflop is input without passing any other flipflop therebetween and is characterized by including: an extraction section for extracting, in the simulation, a pair of a first timing at which an output signal of the first flipflop is changed and a second timing at which an output signal of the second flipflop is changed due to the change of the output signal of the first flipflop, a pair of a first timing at which an output signal of the first flipflop is changed and a second timing at which an input signal of the second flipflop is changed due to the change of the output signal of the first flipflop, or a pair of a first timing at which an input signal of the second flipflop is changed and a second timing at which an output signal of the second flipflop is changed due to the change of the input signal of the second flipflop; and an output section for outputting information corresponding to a clock cycle number from the extracted first timing to the extracted second timing, based on a result of the extraction of the extraction section.

Thus, a proper multicycle number for use as a logic synthesis constraint condition can be obtained and whether or not a multicycle number prepared as a logic synthesis constraint condition in advance is proper for use in logic synthesis can be verified in a simple manner.

Herein, information corresponding to a clock cycle number from the first timing to the second timing is information indicating the clock cycle number, information used for obtaining the clock cycle number, or information based on the clock cycle number.

As information used for obtaining the clock cycle number, any information can be used as long as the clock cycle number can be obtained using the information. An example of such information includes a waveform diagram of signals showing the first and second timings.

Information based on the clock cycle number is information which can be obtained based on the clock cycle number. For example, information indicating whether or not there is any case where the clock cycle number from the first timing to the second timing is smaller than the specified clock cycle number which has been specified in advance, or information indicating a smallest one of a plurality of clock cycle numbers.

A second aspect of the present invention is directed to a simulation system for performing simulation of an operation of a circuit when it is assumed that a delay does not occur in a combination logic circuit, based on circuit information indicating a circuit configuration of the circuit including a first flipflop and a second flipflop to which an output signal of the first flipflop is input without passing any other flipflop therebetween and is characterized by including: a particular signal substituting section for making, in the simulation, an output signal of the first flipflop or an input signal of the second flipflop be a particular signal indicating neither high level nor low level during a period which is 1 cycle shorter than a specified clock cycle number of a multicycle path which has been specified in advance; and an output section for outputting information corresponding to whether or not a signal at an output terminal of the second flipflop or at part of the circuit located in a subsequent stage of the output terminal of the second flipflop, which has been specified in advance, is made to be the particular signal.

A third aspect of the present invention is directed to a simulation system for performing simulation of an operation of a circuit when it is assumed that a delay does not occur in a combination logic circuit, based on circuit information indicating a circuit configuration of the circuit including a first flipflop and a plurality of second flipflops to which an output signal of the first flipflop is input without passing any other flipflop therebetween and is characterized by including: a particular signal substituting section for treating, in the simulation, an output signal of the first flipflop as an independent signal on each of signal paths from the first flipflop to the second flipflops and making each output signal of the first flipflop be a particular signal which is neither high level nor low level during a period which starts from a timing of change of the output signal of the first flipflop and is 1 cycle shorter than a specified clock cycle number which has been specified in advance for each of the paths; and an output section for outputting information, with respect to each of the output signals of the first flipflop, which corresponds to whether or not a signal at an output terminal of the second flipflop or at part of the circuit located in a subsequent stage of the output terminal of the second flipflop, which has been specified in advance, is made to be the particular signal.

Herein, information corresponding to whether or not a signal at an output terminal of the second flipflop or at part of the circuit located in a subsequent stage of the output terminal of the second flipflop, which has been specified in advance, is made to be the particular signal is information indicating whether or not a signal at an output terminal of the second flipflop or at part of the circuit located in a subsequent stage of the output terminal of the second flipflop, which has been specified in advance, is made to be the particular signal, information for judging whether or not a signal at an output terminal of the second flipflop or at part of the circuit located in a subsequent stage of the output terminal of the second flipflop, which has been specified in advance, is made to be the particular signal, or information based on whether or not a signal at an output terminal of the second flipflop or at part of the circuit located in a subsequent stage of the output terminal of the second flipflop, which has been specified in advance, is made to be the particular signal.

According to the above-described inventive aspects, a proper multicycle number for use as a logic synthesis constraint condition can be obtained and whether or not a multicycle number prepared as a logic synthesis constraint condition in advance is proper for use in logic synthesis can be verified in a simple manner.

As information for judging whether or not a signal at an output terminal of the second flipflop or at part of the circuit located in a subsequent stage of the output terminal of the second flipflop, which has been specified in advance, is made to be the particular signal, any information may be used as long as whether or not the signal located at the part specified in advance is made to be the particular signal can be judged using the information. An example of such information is a waveform of the signal at the part specified in advance.

The information based on whether or not a signal at an output terminal of the second flipflop or at part of the circuit located in a subsequent stage of the output terminal of the second flipflop, which has been specified in advance, is made to be the particular signal is information which can be obtained based on whether or not the signal at the part specified in advance is made to be the particular signal. For example, information indicating a largest number of ones of a plurality of different specified clock cycle numbers specified in advance with which the signal at an output terminal of the second flipflop or at part of the circuit located in a subsequent stage of the output terminal of the second flipflop, which has been specified in advance, is not made to be the particular signal.

Effects Of The Invention

According to the present invention, accurate information for a multicycle path can be obtained in a simple manner.

BRIEF DESCRIPTION OF THE DRAWINGS

FIG. 9 is a diagram showing exemplary RTL description to be input to the simulation system of Embodiment 3 of the present invention.

FIG. 10 is a diagram showing exemplary RTL description to be output by a circuit information conversion section 301 of the simulation system of Embodiment 3 of the present invention.

EXPLANATION OF REFERENCE NUMERALS

Figure 1:
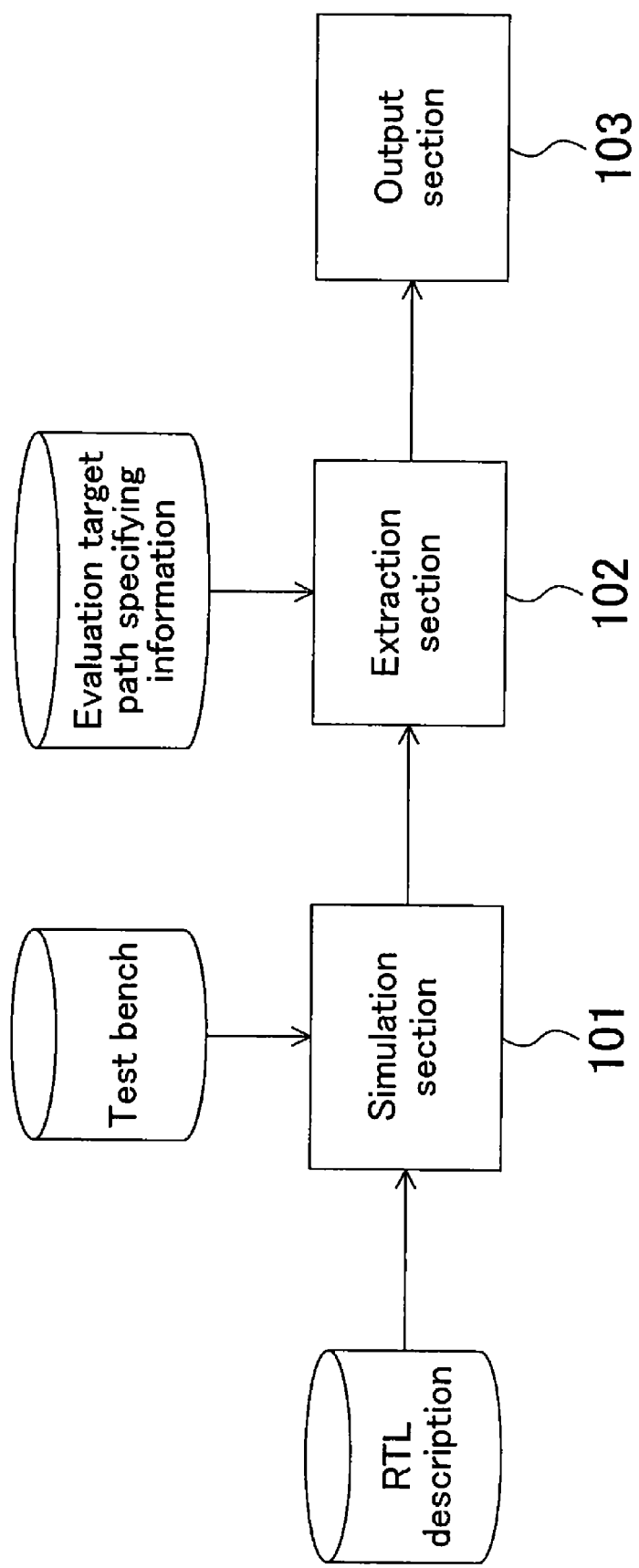
FIG. 1 is a block diagram illustrating a configuration of a simulation system according to Embodiment 1 of the present invention.

101 Simulation section
102 Extraction section
103 Output section
201 Particular signal substituting section
202 Output section
301 Circuit information conversion section
302 Particular signal substituting section

BEST MODE FOR CARRYING OUT THE INVENTION

Hereafter, embodiments of the present invention will be described with reference with the accompanying drawings. Note that in the following embodiments, each component having substantially the same function is identified by the same reference numeral and therefore the description thereof will be omitted.

Embodiment 1 of the Invention

A simulation system according to this embodiment performs simulation of an operation of a circuit based on RTL description indicating a circuit configuration of the circuit including a first flipflop and a second flipflop to which an output signal of the first flipflop is input without passing through any other flipflop therebetween. Specifically, as shown in FIG. 1, the simulation system includes a simulation section 101, an extraction section 102 and an output section 103.

RTL description indicating a circuit configuration of a circuit to be simulated and a test bench are input to the simulation section 101. Evaluation target path specifying information indicating a signal propagation path to be evaluated is input to the extraction section 102. More specifically, the evaluation target path specifying information is information to specify a data output terminal of the first flipflop and a data output terminal of the second flipflop.

The simulation section 101 performs simulation of a circuit operation using the RTL description and test bench for the circuit to be simulated and outputs a signal level at each timing on each node of the circuit. Herein, the "simulation" means simulation of a circuit operation when no delay occurs in a combinational logic circuit.

The extraction section 102 refers to, among simulation results, a signal level of an output signal output from a data output terminal of the first flipflop (output signal from the first flipflop) at each timing and an output signal output from a data output terminal of the second flipflop (output signal from the second flipflop) at each timing. Each time the output signal of the first flipflop is changed in simulation, a first timing at which the output signal is changed and a second timing at which the output signal of the second flipflop is changed due to the change of the output signal of the first flipflop are extracted. Specifically, after the first timing, a timing at which the output signal of the second flipflop is changed for the first time is extracted as the second timing.

The output section 103 displays on a display a simulation waveform diagram for signals of which the first timing and the second timing are extracted by the extraction section 102. More specifically, in the simulation waveform diagram, a waveform of the output signal of the first flipflop at the first timing and a waveform of the output signal of the second flipflop at the second timing are indicated by solid lines.

An exemplary operation when the simulation system of this embodiment performs simulation of a circuit including a circuit of FIG. 2 will be described.

Figure 2:
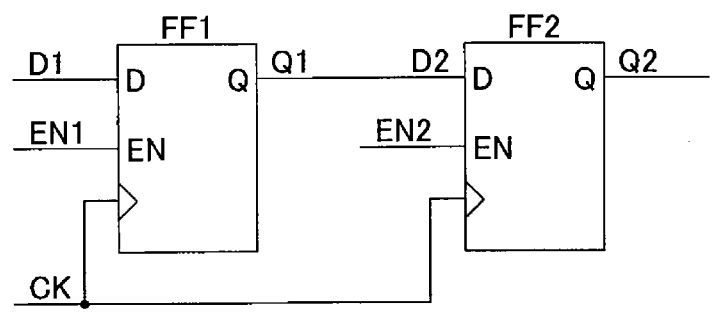
FIG. 2 is a circuit configuration illustrating part of a logic circuit to be simulated by the simulation system of Embodiment 1 or 2 of the present invention.

First, the simulation section 101 performs simulation using RTL description indicating that the circuit which includes the circuit of FIG. 2 and is to be simulated and a test bench. In this example, it is assumed that, as evaluation target path specifying information, information specifying an output terminal Q of a flipflop FF1 and an output terminal Q of a flipflop FF2 is input to the extraction section 102. The extraction section 102 then refers to, among simulation results, a signal level of a signal Q1 at the output terminal Q of the flipflop FF1 at each timing and a signal level of a signal Q2 at the output terminal Q of the flipflop FF2 at each timing and extracts a first timing at which the signal Q1 is changed and a second timing at which the signal Q2 is changed for the first time after the first timing. The output section 103 displays waveforms of signals shown in FIG. 3 on the display. An operator can understand how many clock cycles have elapsed from the first timing to the second timing in a simple manner by visually observing the displayed waveforms. That is, a value indicating a desired number of clock cycles of a delay of a signal propagation path from the output terminal Q of the flipflop FF1 to the output terminal Q of the flipflop FF2 for which synthesis is to be performed can be obtained.

Figure 3:
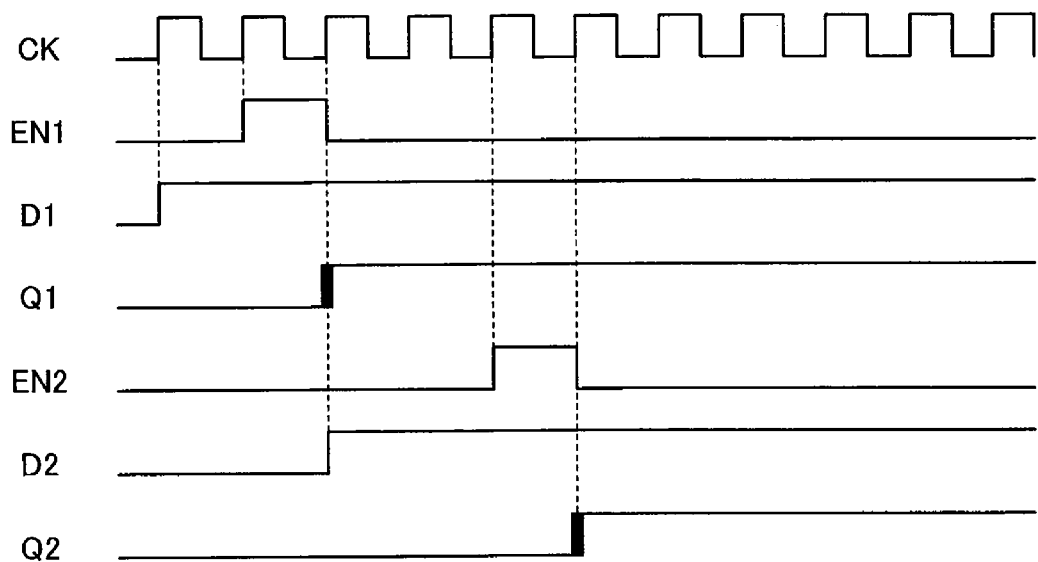
FIG. 3 is a simulation waveform diagram output by the simulation system of Embodiment 1 of the present invention.

Note that the waveforms of FIG. 3 show an example where the signal Q1 is changed only once. However, when the signal Q1 is changed a plurality of times, the output section displays waveforms indicating a plurality of pairs of the first and second timings on the display.

With the simulation system of this embodiment, an operator can reliably obtain an optimal multicycle number by inputting to the simulation section 101 a test bench of simulation in which all combination patterns are input to inputs of a circuit to be simulated. Moreover, simulation in which, of all combination patterns, only combination patterns which can be actually assumed are input may be performed.

Modified Example 1 of Embodiment 1 of the Invention

Next, as Modified Example 1 of Embodiment 1, a simulation system for outputting information indicating whether or not the specified clock cycle number which has been specified in advance is proper for use as the multicycle number of a logic synthesis constraint condition will be described.

The simulation system of this modified example includes, instead of the output section 103 of Embodiment 1, an output section for receiving a specified clock cycle number which has been specified in advance and outputting information to indicate whether or not there is any case where a clock cycle number from the first timing to the second timing is smaller than the specified clock cycle number. An output format of the information is not limited to a format in which the information is displayed on the display but a signal indicating the information may be output so that another device can recognize the information.

For example, assume that in a circuit including the circuit of FIG. 2, a signal propagation path from the output terminal Q of the flipflop FF1 to the output terminal Q of the flipflop FF2 is a signal propagation path to be evaluated and a signal level of each terminal obtained by the simulation section 101 at each timing is as shown in FIG. 3. In this case, the output section of this modified example obtains, based on the first and second timings extracted by the extraction section 102, information that the clock cycle number from the first timing to the second timing is 3 and outputs information indicating whether or not the specified clock cycle number is 3 or more.

Note that in FIG. 3, the signal Q1 is changed only once and only a pair of the first and second timings are extracted. However, if a plurality of pairs of the first and second timings are extracted, the output section outputs the information indicating whether or not there is any one of the plurality of pairs with which the clock cycle number from the first timing to the second timing which is smaller than the specified clock cycle number.

With the simulation system including the above-described output section, reliable information indicating whether or not the specified clock cycle number is proper for use as the multicycle number of a logic synthesis constraint condition can be obtained by inputting to the simulation section 101 a test bench of simulation in which all combination patterns are input to inputs of a circuit to be simulated. If the information indicating that there is a case where the clock cycle number from the first timing to the second timing is smaller than the specified clock cycle number is output, it is judged that the specified clock cycle number is not proper for use as the multicycle number of a logic synthesis constraint condition. If the information indicating that there is no case where the clock cycle number from the first timing to the second timing is smaller than the specified clock cycle number is output, it is judged that the specified clock cycle number is proper for use as the multicycle number of a logic synthesis constraint condition. Note that simulation in which, of all the combination patterns, only combination patterns which can be actually assumed are input may be performed.

Modified Example 2 of Embodiment 1 of the Present Invention

Next, as Modified Example 2 of Embodiment 1, a simulation system including, instead of the output section 103 of Embodiment 1, an output section for outputting a proper clock cycle number for use as a multicycle number of a logic synthesis constraint condition will be described.

The output section of this modified example outputs information indicating, when the extraction section extracts a plurality of pairs of the first and second timings, a clock cycle number from the first timing to the second timing of one of the pairs having a smallest difference between the first and second timings. If only a pair of the first and second timings are extracted by the extraction section, the output section outputs information indicating a clock cycle number corresponding to a difference between the first and second timings. An output format of the information is not limited to a format in which the information is displayed on the display but a signal indicating the information may be output so that another device can recognize the information.

With the simulation system including the above-described output section, an optimal multicycle number can be reliably obtained by inputting to the simulation section 101 a test bench of simulation in which all combination patterns are input to inputs of a circuit to be simulated. Moreover, simulation in which, of all the combination patterns, only combination patterns which can be actually assumed are input may be performed.

Another Modified Example of Embodiment 1 of the Invention

In each of Embodiment 1 and Modified Examples 1 and 2 of Embodiment 1, a timing at which an output signal of the first flipflop is changed and a timing at which an output signal of the second flipflop is changed are extracted as the first and second timings, respectively. However, a timing at which an output signal of the first flipflop is changed and a timing at which an input signal of the second flipflop is changed may be extracted as the first and second timings, respectively. Also, a timing at which an input signal of the second flipflop is changed and a timing at which an output signal of the second flipflop is changed may be the first and second timings, respectively.

Embodiment 2

Figure 4:
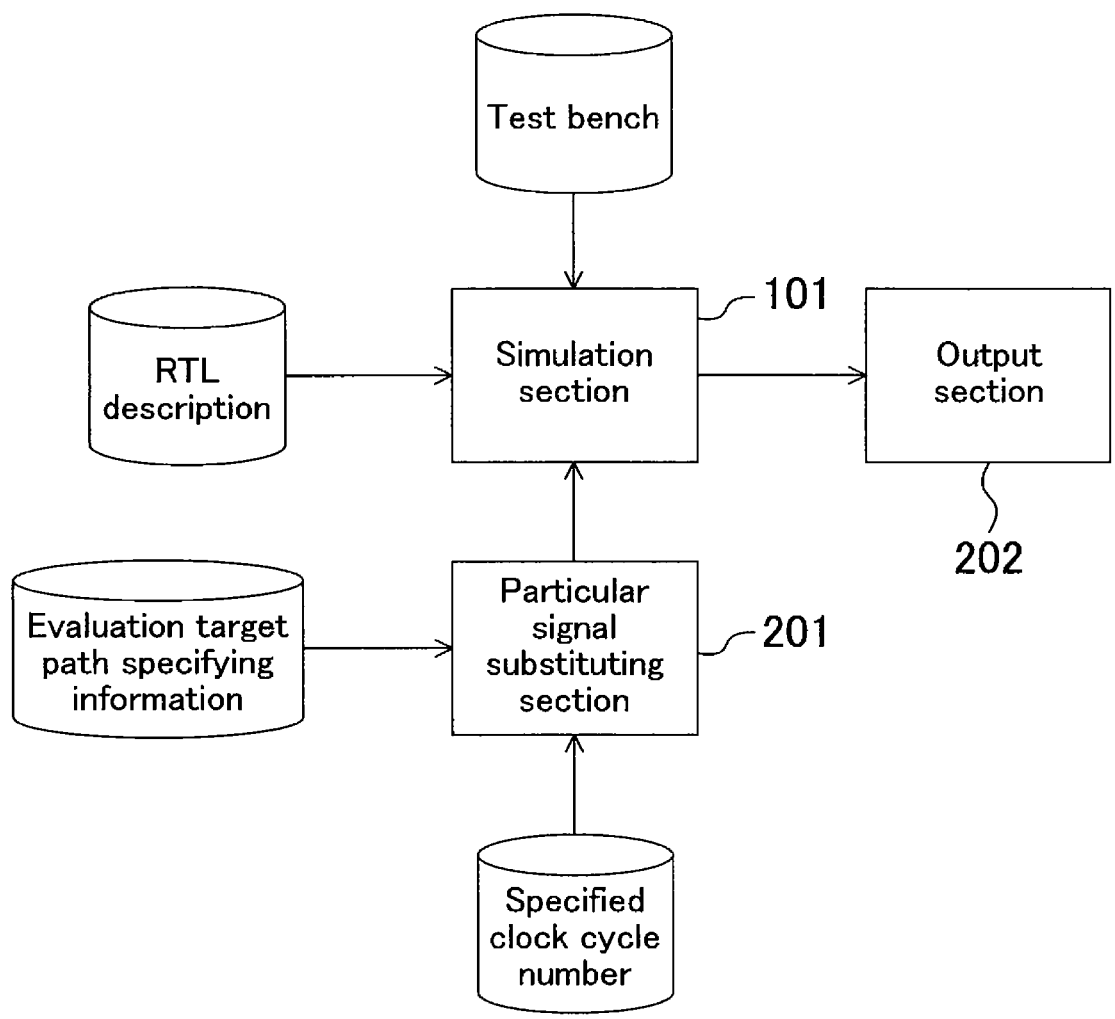
FIG. 4 is a block diagram illustrating a configuration of a simulation system of Embodiment 2 of the present invention.

A simulation system according to this embodiment also performs simulation of an operation of a circuit based on RTL description indicating a circuit configuration of the circuit including a first flipflop and a second flipflop to which an output signal of the first flipflop is input without passing through any other flipflop therebetween. Specifically, as shown in FIG. 4, the simulation system of this embodiment includes a simulation section 101, a particular signal substituting section 201 and an output section 202.

Evaluation target path specifying information indicating a signal propagation path to be evaluated and a specified clock cycle number which has been specified in advance are input to the particular signal substituting section 201. More specifically, the evaluation target path specifying information is information specifying a data output terminal of the first flipflop and a data output terminal of the second flipflop.

In simulation by the simulation section 101, each time an output signal output from the data output terminal of the first flipflop (referred to as an output signal of the first flipflop) is changed, the particular signal substituting section 201 makes an input signal of the second flipflop be an indefinite signal (i.e., a particular signal indicating a state which is neither high level nor low level).

The output section 202 displays a simulation waveform of each signal on a display.

An exemplary operation when the simulation system of this embodiment performs simulation of a circuit including the circuit of FIG. 2 will be described. In this example, 3 and information specifying the output terminal Q of the flipflop FF1 and the output terminal Q of the flipflop FF2 are input as the specified clock cycle number and the evaluation target path specifying information, respectively, to the particular signal substituting section 201.

First, the simulation section 101 performs simulation using RTL description indicating a circuit which includes the circuit of FIG. 2 and is to be simulated and a test bench. During the simulation, each time the signal Q1 of the flipflop FF1 is changed, the particular signal substituting section 201 makes an input signal D2 of the flipflop FF2 be an indefinite signal during two clock cycles, which is 1 cycle shorter than the specified clock cycle number, i.e., 3, from a timing at which the signal Q1 is changed. Then, the output section 202 displays, for example, simulation waveforms of FIG. 5.

Figure 5:
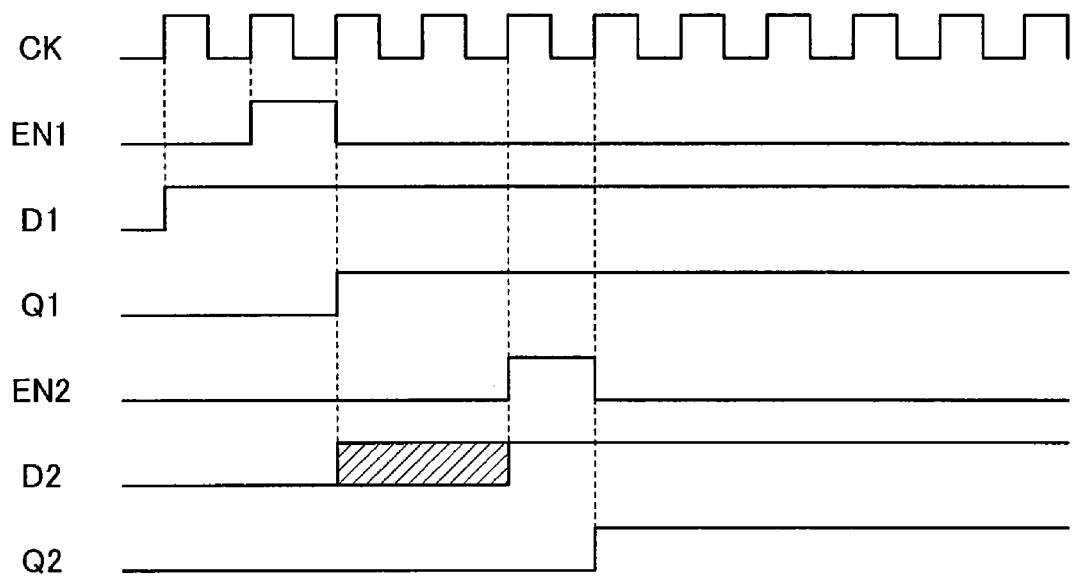
FIG. 5 is an exemplary waveform simulation diagram output by the simulation system of Embodiment 2 of the present invention.

Note that the waveforms of FIG. 5 show an example where the signal Q1 is changed only once. If the signal Q1 is changed a plurality of times, the output section displays on the display simulation waveforms where the signal Q1 is made an indefinite signal a plurality of times.

An operator can judge whether or not a specified clock cycle number is proper for use as a multicycle number of a logic synthesis constraint condition in a simple manner by visually observing the displayed waveforms and confirming whether the signal Q2 of the flipflop FF2 is made to be an indefinite signal. If the signal Q2 is not made to be an indefinite signal at all, it is judged that the specified clock cycle number is proper for use as a multicycle number of a logic synthesis constraint condition. If the signal Q2 is made to be an indefinite signal even once, it is judged that the specified clock cycle number is not proper for use as the multicycle number. For example, by observing the simulation waveforms of FIG. 5, the signal Q2 is not made to be an indefinite signal at all, it is judged that the specific clock cycle, i.e., 3 is proper for use as a multicycle number of a logic synthesis constraint condition.

Figure 6:
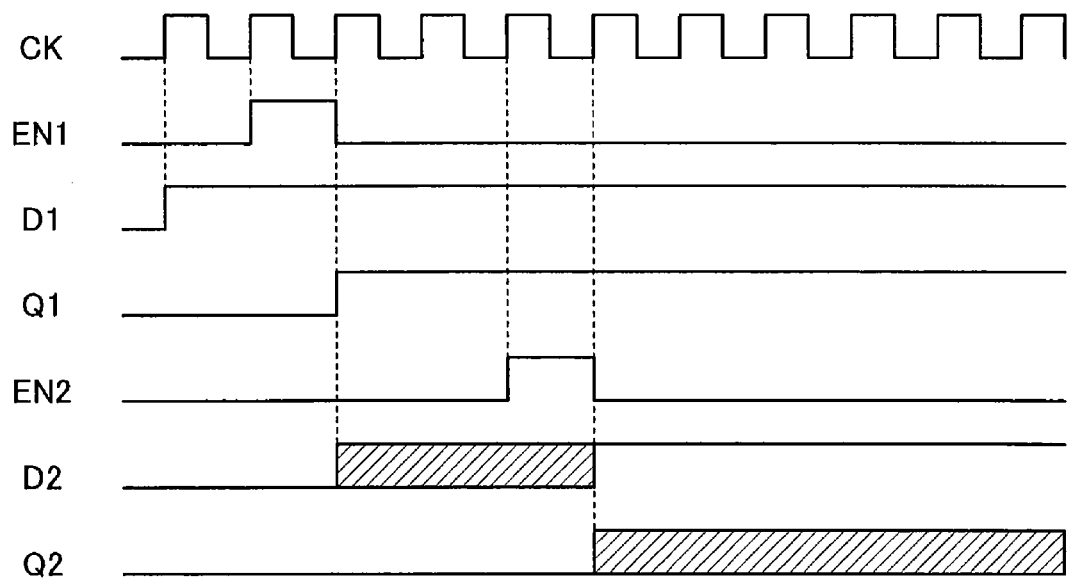
FIG. 6 is an exemplary waveform simulation diagram output by the simulation system of Embodiment 2 of the present invention.

In contrast, when 4 is input as the specified clock cycle number to the particular signal substituting section 201 and the output section 202 displays simulation waveforms of FIG. 6 on the display, the signal Q2 is made to be an indefinite signal and thus it is judged that the specified clock cycle number, i.e., 4 is not proper for use as a multicycle number of a logic synthesis constraint condition.

With the simulation system of this embodiment, an operator can reliably understand whether or not the specified clock cycle number is proper for use as a multicycle number of a logic synthesis constraint condition by inputting to the simulation section 101 a test bench of simulation in which all combination patterns are input to inputs of a simulation target circuit. Moreover, simulation in which, of all combination patterns, only combination patterns which can be actually assumed are input may be performed.

Modified Example 1 of Embodiment 2

Next, as Modified Example 1 of Embodiment 2, a simulation system for outputting information indicating whether or not the specified clock cycle number which has been specified in advance is proper for use as a multicycle number of a logic synthesis constraint condition will be described.

The simulation system of this modified example includes, instead of the output section 202 of Embodiment 2, an output section for judging in simulation whether or not an output signal of the second flipflop is made to be an indefinite signal and outputting not simulation waveforms but information indicating whether or not an output signal of the second flipflop is made to be an indefinite signal. An output format of the information is not limited to a format in which the information is displayed on the display but a signal indicating the information may be output so that another device can recognize the information.

With the simulation system of this modified example including the above-described output section, reliable information indicating whether or not a specified clock cycle number is proper for use as a multicycle number of a logic synthesis constraint condition can be obtained by inputting to the simulation section 101 a test bench of simulation in which all combination patterns are input to inputs of a circuit to be simulated. Note that simulation in which, of all the combination patterns, only combination patterns which can be actually assumed are input may be performed.

Modified Example 2 of Embodiment 2 of the Invention

Next, as Modified Example 2 of Embodiment 2, a simulation system including, instead of the output section 202 of Embodiment 2, an output section for outputting information indicating a proper clock cycle number for use as a multicycle number of a logic synthesis constraint condition will be described.

In the simulation system of this modified example, a plurality of different specified clock cycle numbers are input to the particular signal substituting section 201 and the simulation section 101 performs simulation for each of the specified clock cycle numbers, in which an input signal of the second flipflop is substituted by an indefinite signal only during a period which is 1 cycle shorter than the specified clock cycle number.

The output section of this modified example judges whether or not there is any case where an output signal of the second flipflop is made to be an indefinite signal in each simulation. Moreover, the output section outputs information indicating a largest specified clock cycle number of the specified clock cycle numbers with which an output signal of the second flipflop is not made to be an indefinite signal. An output format of the information is not limited to a format in which the information is displayed on the display but a signal indicating the information may be output so that another device can recognize the information.

With the simulation system including the above-described output section, an optimal multicycle number can be reliably understood by inputting to the simulation section 101 a test bench of simulation in which all the combination patterns are input to inputs of a circuit to be simulated. Moreover, simulation in which, of all combination patterns, only combination patterns which can be actually assumed are input may be performed.

Another Modified Example of Embodiment 2 of the Invention

In each of Embodiment 2 and Modified Examples 1 and 2 of Embodiment 2, the input signal of the second flipflop is made to be an indefinite signal by the particular signal substituting section 201. However, the output signal of the first flipflop may be made to be an indefinite signal.

Embodiment 3

Figure 7:
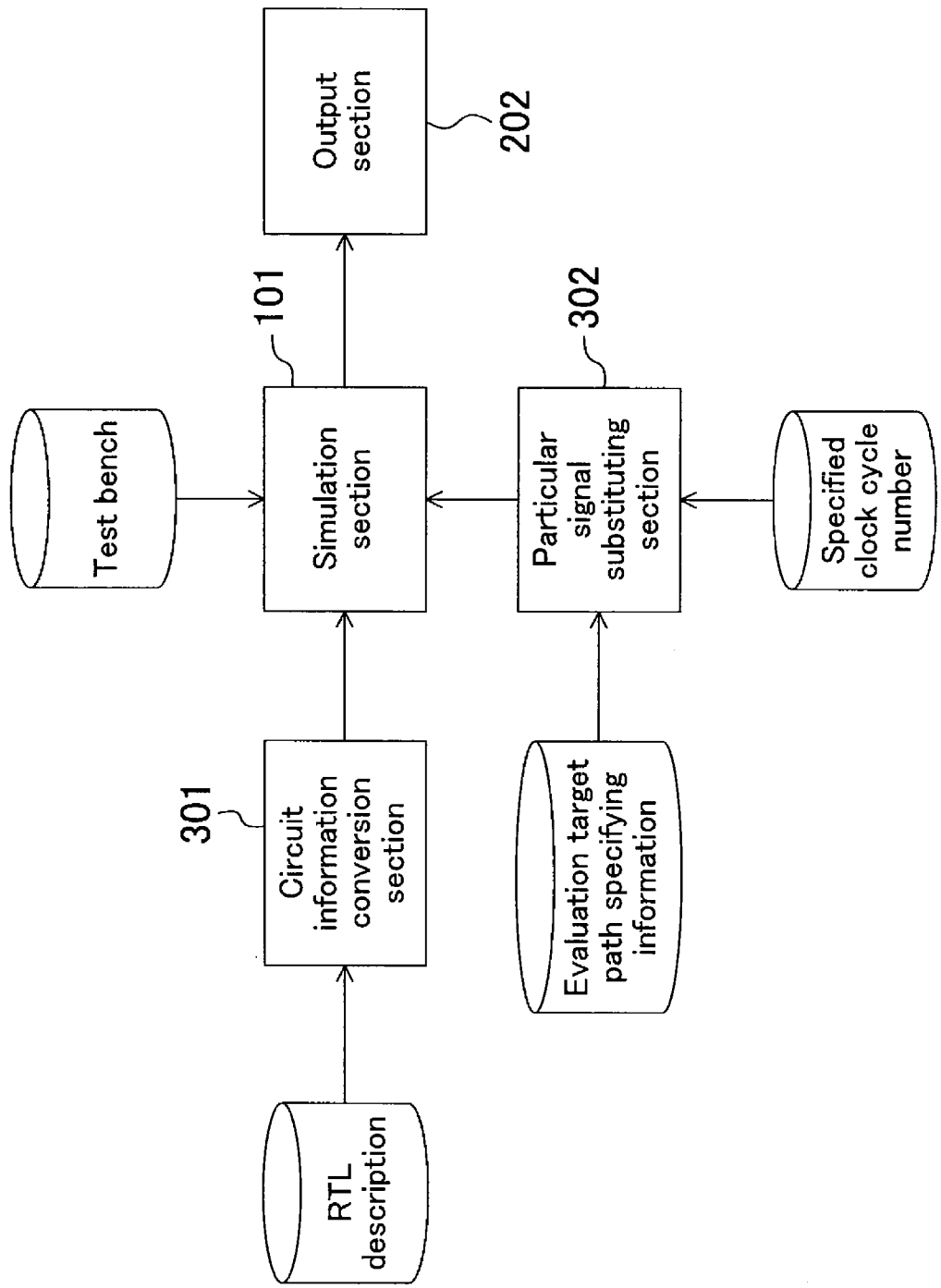
FIG. 7 is a block diagram illustrating a configuration of a simulation system according to Embodiment 3 of the present invention.

A simulation system according to this embodiment performs simulation of an operation of a circuit based on RTL description indicating a circuit configuration of the circuit including a first flipflop and a second flipflop to which an output signal of the first flipflop is input without passing any other flipflop therebetween. Specifically, as shown in FIG. 7, the simulation system includes a circuit information conversion section 301, a simulation section 101, a particular signal substituting section 302 and an output section 202.

When a signal line from a data output terminal of the first flipflop which is branched into a plurality of signal lines and then connected to data input terminals of a plurality of second flipflops is indicated in the RTL description, the circuit information conversion section 301 converts the RTL description to RTL description in which the signal lines independently extends from the data output terminal of the first flipflop and are connected to the data input terminals of the second flipflops, respectively.

The simulation section 101 of this embodiment performs simulation for a circuit indicated by the converted RTL description for each of the independent signal lines.

In simulation for each of the independent signal lines, each time an output signal from the first flipflop is changed, during a period corresponding to a cycle number of a multicycle path specified in advance for the independent signal line from the timing of the change, the particular signal substituting section 302 makes an output signal output from the first flipflop to the independent signal line be an indefinite signal.

Now, an exemplary operation when the simulation system of this embodiment performs simulation of a circuit including a circuit of FIG. 8 will be described. In this exemplary operation, information specifying an output terminal Q of a flipflop FF1 and an output terminal Q of a flipflop FF2 and 3 are input as evaluation target path and a specific clock cycle of the signal propagation path to the particular signal substituting section 302.

Figure 8:
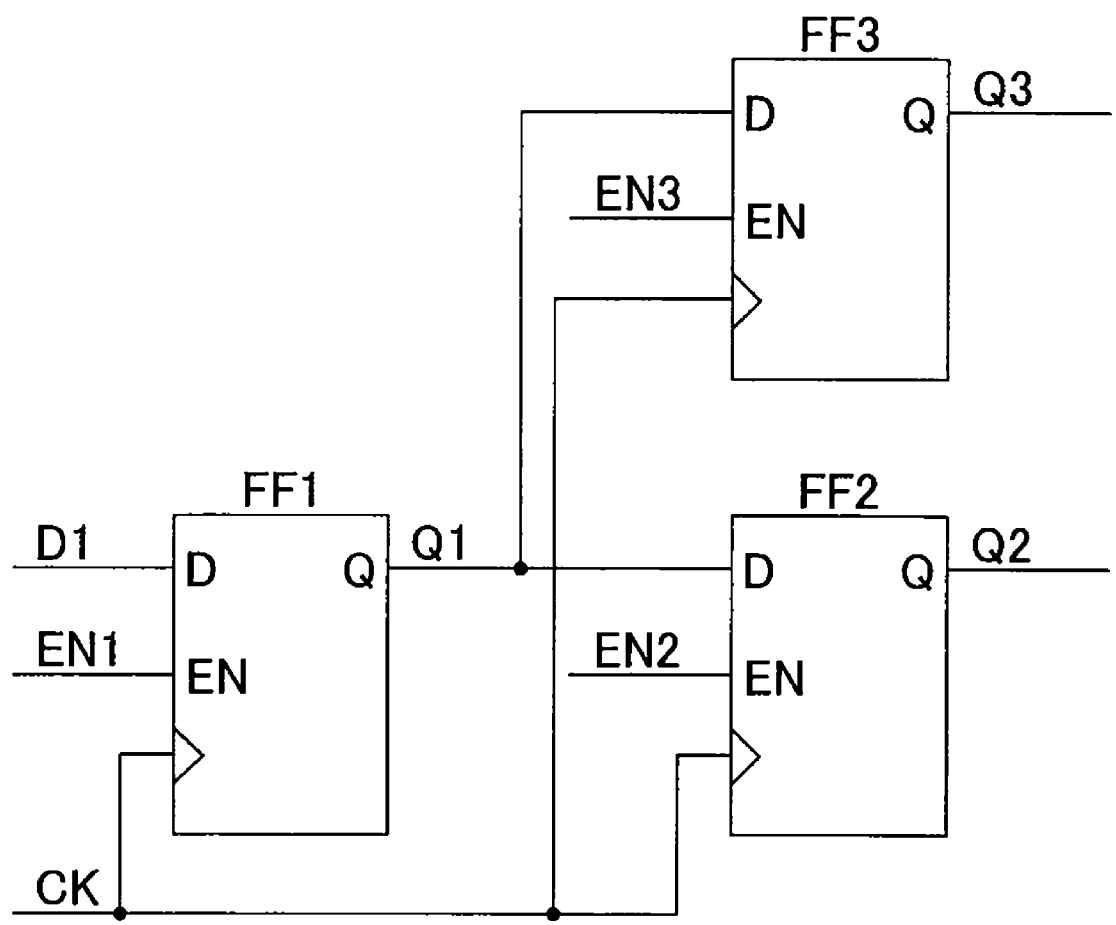
FIG. 8 is a circuit configuration illustrating part of a logic circuit to be simulated by the simulation system of Embodiment 3 of the present invention.

First, RTL description indicating a circuit configuration of a circuit which includes the circuit of FIG. 8 and is to be simulated is input to the circuit information conversion section 301. The RTL description to be input includes RTL description of FIG. 9 indicating a circuit configuration of FIG. 8. Accordingly, the circuit information conversion section 301 converts the RTL description of FIG. 9 to RTL description of FIG. 10 in which branch paths from the flipflop FF1 to the flipflop FF2 and a flipflop FF3 are indicated as independent signal lines. Part of the RTL description describing other part of the circuit to be simulated than the circuit of FIG. 8 is subjected to the same processing and then the converted RTL description is output. Then, the simulation section 101 performs simulation using a test bench and the converted RTL description. While the simulation is performed, during 2 clock cycles, which is 1 cycle shorter than the specified clock cycle number, i.e., 3 in the simulation, the particular signal substituting section 302 makes a signal denoted by Q1A in the RTL description of FIG. 10 be an indefinite signal. Then, the output section 202 displays, for example, simulation waveforms of FIG. 11 on a display.

Figure 11:
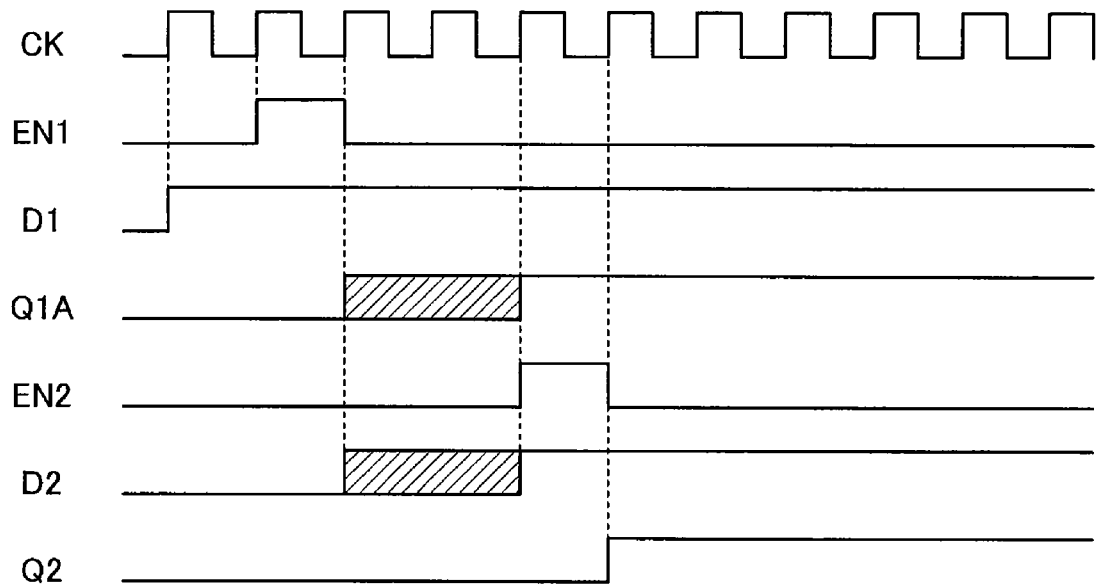
FIG. 11 is an exemplary waveform simulation diagram output by the simulation system of Embodiment 3 of the present invention.

Note that the waveforms of FIG. 11 show an example where the output signal of the flipflop FF1 is changed only once. However, when the output signal of the flipflop FF1 is changed a plurality of times, the output section displays on the display simulation waveforms indicating that the signal Q1A is made to be an indefinite signal a plurality of times.

An operator can judge whether or not the specific clock cycle is proper for use as a multicycle number of a logic synthesis constraint condition in a simple manner by visually observing the displayed waveforms. If the signal Q2 is not made to be an indefinite signal, it is judged that the specified clock cycle number is proper for use as the multicycle number of a logic synthesis constraint condition. If the signal Q2 is made to be an indefinite signal, it is judged that the specified clock cycle number is not proper for use as the multicycle number. For example, by observing the simulation waveforms of FIG. 11, the signal Q2 is not made to be an indefinite signal and thus it is judged that the specified clock cycle number, i.e., 3 is proper for use as the multicycle number of a logic synthesis constraint condition.

Figure 12:
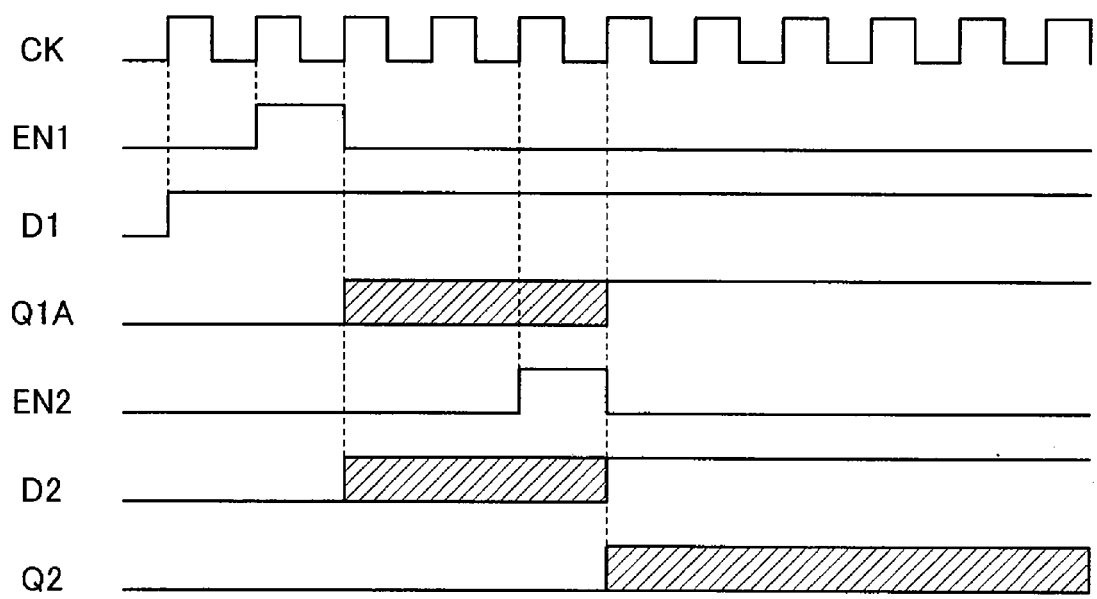
FIG. 12 is an exemplary waveform simulation diagram output by the simulation system of Embodiment 3 of the present invention.

Assume that 4 is input as the specified clock cycle number to the particular signal substituting section 302 and the output section 202 displays simulation waveforms of FIG. 12 on the display. In this case, the signal Q2 is made to be an indefinite signal and thus it is judged that the specified clock cycle number, i.e., 4 is not proper for use as the multicycle clock number of a logic synthesis constraint condition.

With the simulation system of this embodiment, an operator can reliably understand whether or not the specified clock cycle number is proper for use as the multicycle number of a logic synthesis constraint condition by inputting to the simulation section 101 a test bench of simulation in which all combination patterns are input to inputs of a simulation target circuit. Moreover, simulation in which, of all combination patterns, only combination patterns which can be actually assumed are input may be performed.

Modified Example of Embodiment 3 of the Invention

Next, as Modified Example 1 of Embodiment 3, a simulation system for outputting information indicating whether or not a specified clock cycle number which has been specified in advance is proper for use as a multicycle number of a logical synthesis constraint condition will be described.

The simulation system of this modified example includes, instead of the output section 202 of Embodiment 3, an output section for judging in simulation whether an output signal of the second flipflop is made to be an indefinite signal and outputting not simulation waveforms but information indicating whether or not the output signal of the second flipflop is made to be an indefinite signal. An output format of the information is not limited to a format in which the information is displayed on the display but a signal indicating the information may be output so that another device can recognize the information.

With the simulation system including the above-described output section, whether or not the specified clock cycle number is proper for use as the multicycle number of a logic synthesis constraint condition can be reliably understood by inputting to the simulation section 101 a test bench of simulation in which all combination patterns are input to inputs of a circuit to be simulated. Moreover, simulation in which, of all combination patterns, only combination patterns which can be actually assumed are input may be performed.

Modified Example 2 of Embodiment 3 of the Invention

Next, as Modified Example 2 of Embodiment 3, a simulation system including, instead of the output section 202 of Embodiment 3, an output section for outputting a proper clock cycle number for use as a multicycle number of a logic synthesis constraint condition will be described.

In the simulation system of this modified example, a plurality of different specified clock cycle numbers are input to the particular signal substituting section 302 to evaluate each of independent signal lines.

The simulation section 101 performs simulation for each of the specified clock cycle numbers. In each simulation, an output signal to be output from the first flipflop to an independent signal line to be evaluated is substituted by an indefinite signal only during a period which is 1 cycle shorter than the specified clock cycle number.

The output section of this modified example judges whether or not, in each simulation, there is any case where the output signal of the second flipflop is made to be an indefinite signal. Then, the output section outputs information indicating a largest specified clock cycle number of the specified clock cycle numbers with which the output signal of the second flipflop is not made to be an indefinite signal. An output format of the information is not limited to a format in which the information is displayed on the display but a signal indicating the information may be output so that another device can recognize the information.

With the simulation system including the above-described output section, an optimal multicycle number can be reliably understood by inputting to the simulation section 101 a test bench of simulation in which all the combination patterns are input to inputs of a circuit to be simulated. Moreover, simulation in which, of all combination patterns, only combination patterns which can be actually assumed are input may be performed.

Other Embodiments

In each of Embodiment 2 and Embodiment 3, as shown in FIG. 5, FIG. 6, FIG. 11 and FIG. 12, a simulation waveform of the signal Q2 is displayed on the display. However, a simulation waveform of a signal at a node located closer to the output side than the output terminal of the flipflop FF2 may be displayed. That is, a simulation waveform of a signal at a node at an output terminal of the flipflop FF2 or in a subsequent stage of the output terminal may be displayed. For example, a simulation waveform of a signal output from an external terminal of a circuit to be simulated may be displayed.

Each of the output sections of Modified Examples 1 and 2 of each of Embodiments 2 and 3 may judge whether or not the output signal of the second flipflop is made to be an indefinite signal. However, each of the output sections may judge whether or not a signal at a node located closer to the output side than the output terminal of the second flipflop is made to be an indefinite signal. That is, each of the output sections may judge whether or not a signal at a node at an output terminal of the second flipflop or in a subsequent stage of the output terminal is made to be an indefinite signal. For example, each of the output sections may judge whether or not a signal output from an external terminal of a circuit to be simulated is made to be an indefinite signal and output information corresponding to a result of the judgment.

Moreover, the output section may output a simulation waveform of a signal at a node located closer to the output side than the output terminal of the second flipflop or information corresponding to a result of judgment on whether or not a signal at the node is made to be an indefinite signal also when the particular signal substituting section 201 in each of the simulation systems of Embodiment 2 and Modified Examples 1 and 2 of Embodiment 2 makes not the input signal of the second flipflop but the output signal of the first flipflop to be an indefinite signal. In this case, however, the following problem arises when a signal propagation path to be evaluated is branched to a plurality of flipflops. For example, assume that a circuit including the circuit of FIG. 8 is to be simulated and a path from the output signal Q1 of the flipflop FF1 to the input terminal D of the flipflop FF2 in FIG. 8 is a signal propagation path to be evaluated. Then, when the output signal of the flipflop FF1 is made to be an indefinite signal by the particular signal substituting section 201, the indefinite signal is propagated to the flipflop FF3. Accordingly, there might be cases where, even when the signal Q2 at the output terminal Q of the flipflop FF2 is not made to be indefinite signal, the signal Q3 at the output terminal Q of the flipflop FF3 is made to be an indefinite signal and, because of influence of the signal Q3, a signal at the node is made to be an indefinite signal. As a result, a proper specified clock cycle number for use as the multicycle number of a logic synthesis constraint condition might be judged to be improper by an operator who visually observes a simulation waveform of the signal at the node, information indicating a proper specified clock cycle number as an improper specified clock cycle number might be output by the output section, or information indicating a not optimal clock cycle number as information indicating an optimal clock cycle number might be output.

To cope with this, in each of the simulation systems of Embodiment 3 and Modified Examples 1 and 2 of Embodiment 3, when a path from the signal Q1 of the flipflop FF1 to the input terminal D of the flipflop FF2 is a signal propagation path to be evaluated, the path is treated in simulation as an independent signal line which is independent from a path from the signal Q1 of flipflop FF1 to the input terminal D of the flipflop FF3. Therefore, even when the output signal of the flipflop FF1 is made to be an indefinite signal by the particular signal substituting section 201, the indefinite signal is not propagated to the flipflop FF3 and thus the above-described problem does not arise.

Specifically, in the simulation system of Embodiment 3, when a signal propagation path to be evaluated is branched to a plurality of flipflops and a simulation waveform of a signal at a node closer to the output side than the output terminal of the second flipflop is displayed, an operator can judge whether or not a specified clock cycle number is proper with high accuracy by visually observing the simulation waveform. In the same manner, even when a signal propagation path to be evaluated is branched to a plurality of flipflops, according to a result of judgment on whether or not a signal at a node located closer to the output side than the output terminal of the second flipflop is made to be an indefinite signal, each of the simulation systems of Modified Examples 1 and 2 of Embodiment 3 can output with high accuracy information indicating whether or not a specified clock cycle number which has been specified in advance or information indicating an optimal clock cycle number.

An indefinite signal used in Embodiment 2, Embodiment 3 or the like is not propagated to an output terminal of an AND circuit and a circuit in a subsequent stage of the output terminal of the AND circuit even when one of input terminals of the AND circuit is low level and, at the same time, the indefinite signal is input to the other one of the input terminals. Also, an indefinite signal is not propagated to an output terminal of an OR circuit and a circuit in a subsequent stage of the output terminal of the OR circuit even when one of input terminals of the OR circuit is high level and, at the same time, the indefinite signal is input to the other one of the input terminals. Accordingly, when an indefinite signal is masked by such an AND circuit or an OR circuit before a signal reaches a node at which judgment on whether or not the signal is made to be an indefinite signal is performed, the signal at the node is not made to be the indefinite signal and it is judged that a specified clock cycle number corresponding to a length of the indefinite signal is proper for use as a multicycle number of a logic synthesis constraint condition.

INDUSTRIAL APPLICABILITY

As has been described, a simulation system according to the present invention has the effect of being able to obtain accurate information for a multicycle path and is useful, for example, as a simulation system for obtaining information for a multicycle path in a digital circuit designed based on a function specification (including an operational specification and a design specification) or the like.

The invention claimed is:
1. A simulation system for performing simulation of an operation of a circuit, the simulation system comprising:
    a particular signal substituting section for making, in the simulation, an output signal of a first flipflop or an input signal of a second flipflop be a particular signal indicat- ing neither high level nor low level during a period which is 1 cycle shorter than a specified clock cycle number of a multicycle path which has been specified in advance; and an output section for outputting information corresponding to whether or not a signal at an output terminal of the second flipflop or at part of the circuit located in a subsequent stage of the output terminal of the second flipflop, which has been specified in advance, is made to be the particular signal, wherein said simulation is based on circuit information indicating a circuit configuration of the circuit including the first flipflop and the second flipflop to which the output signal of the first flipflop is input without passing any other flipflop therebetween.

2. The simulation system of claim 1, wherein the output section is so configured to display a waveform of the signal at the output terminal of the second flipflop or at part of the circuit located in a subsequent stage of the output terminal of the second flipflop, which has been specified in advance, on a display.

3. The simulation system of claim 1, wherein the output section is so configured to output information indicating whether or not, in the simulation, a signal at the output terminal of the second flipflop or at part of the circuit located in a subsequent stage of the output terminal of the second flipflop, which has been specified in advance, is made to be the particular signal.

4. The simulation system of claim 1, wherein the output section is so configured to output information indicating a largest number of ones of a plurality of different specified clock cycle numbers specified in advance with which, in the simulation, the signal at the output terminal of the second flipflop or at part of the circuit located in a subsequent stage of the output terminal of the second flipflop, which has been specified in advance, is not made to be the particular signal.

5. A simulation system for performing simulation of an operation of a circuit, the simulation system comprising:

a particular signal substituting section for treating, in the simulation, an output signal of a first flipflop as an independent signal on each of signal paths from the first flipflop to a plurality of second flipflops; and making each output signal of the first flipflop be a particular signal which is neither high level nor low level during a period which starts from a timing of change of the output signal of the first flipflop and is 1 cycle shorter than a specified clock cycle number which has been specified in advance for each of the paths; and an output section for outputting information with respect to each of the output signals of the first flipflop, which corresponds to whether or not a signal at an output terminal of the second flipflop or at part of the circuit located in a subsequent stage of the output terminal of the second flipflop, which has been specified in advance, is made to be the particular signal, wherein said simulation is based on circuit information indicating a circuit configuration of the circuit including the first flipflop and the plurality of second flipflops to which an output signal of the first flipflop is input without passing any other flipflop therebetween.

6. The simulation system of claim 5, further comprising a circuit information conversion section for converting circuit information indicating signal lines in the circuit to be simulated which are branched from a data output terminal of the first flipflop and connected to data input terminals of the second flipflops, respectively, into circuit information indicating independent signal lines from one another, wherein the particular signal substituting section is so configured to make, in the simulation of the circuit of which the circuit information is converted, each output signal of the first flipflop be the particular signal during a period which starts from a timing of change of the output signal of the first flipflop and is 1 cycle shorter than a specified clock cycle number which has been specified in advance for each of the path.

7. The simulation system of claim 5, wherein the output section is so configured to display, with respect to each output signal of the first flipflop, a waveform of the signal at the output terminal of the second flipflop or at part of the circuit located in a subsequent stage of the output terminal of the second flipflop, which has been specified in advance, on a display.

8. The simulation system of claim 5, wherein the output section is so configured to output, with respect to each output signal of the first flipflop, information indicating whether or not, in the simulation, the signal at an output terminal of the second flipflop or at the part of the circuit located in a subsequent stage of the output terminal of the second flipflop, which has been specified in advance, is made to be the particular signal.

9. The simulation system of claim 5, wherein the output section is so configured to output, with respect to each output signal of the first flipflop, information indicating a largest number of ones of a plurality of different specified clock cycle numbers specified in advance with which, in the simulation, the signal at an output terminal of the second flipflop or at the part of the circuit located in a subsequent stage of the output terminal of the second flipflop, which has been specified in advance, is not made to be the particular signal.

* * * * *